United States Patent
Matsuda et al.

(10) Patent No.: US 6,504,189 B1
(45) Date of Patent: Jan. 7, 2003

(54) SEMICONDUCTOR DEVICE HAVING A MICROSTRIP LINE

(75) Inventors: Hajime Matsuda, Yamanashi (JP); Norikazu Iwagami, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 09/345,384

(22) Filed: Jun. 30, 1999

(30) Foreign Application Priority Data

Jul. 21, 1998 (JP) .......................................... 10-205619

(51) Int. Cl.⁷ ...................... H01L 29/80; H01L 31/112; H01P 3/08
(52) U.S. Cl. ...................... 257/275; 333/238; 333/246
(58) Field of Search ........................ 257/758, 751, 257/753, 272, 275; 333/104, 161, 204, 238, 246, 103

(56) References Cited

U.S. PATENT DOCUMENTS 5,105,055 A  *  4/1992  Mooney et al. ................ 174/27
5,753,975 A  *  5/1998  Matsuno ....................... 257/751
5,900,308 A  *  5/1999  Koike et al. .................. 428/209

FOREIGN PATENT DOCUMENTS

| JP | 59131208 A | 7/1984 |
| JP | 3-21026 | 1/1991 |
| JP | 07273118 A | 10/1995 |
| JP | 08288463 A | 11/1996 |
| JP | 2000031708 A | 1/2000 |

* cited by examiner

*Primary Examiner*—Tom Thomas
*Assistant Examiner*—Shouxiang Hu
(74) *Attorney, Agent, or Firm*—Armstrong, Westerman & Hattori, LLP

(57) ABSTRACT

A microstrip line includes a first conductor pattern formed on a substrate, a second conductor pattern formed on the first conductor pattern with a width substantially identical with a width of the first conductor pattern, and a third conductor pattern formed on the second conductor pattern with a width smaller than the width of the second conductor pattern.

8 Claims, 14 Drawing Sheets

FIG.3 PRIOR ART
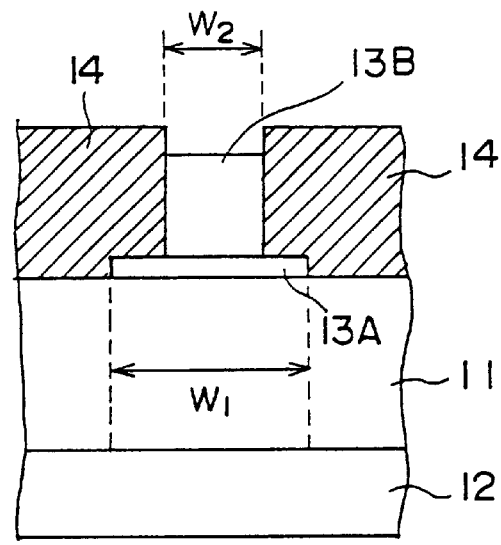
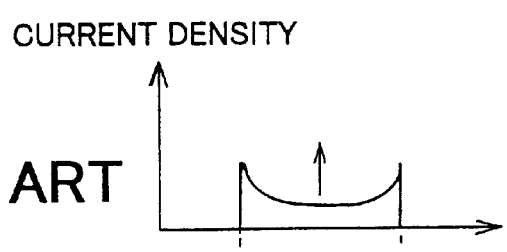
FIG.4A PRIOR ART
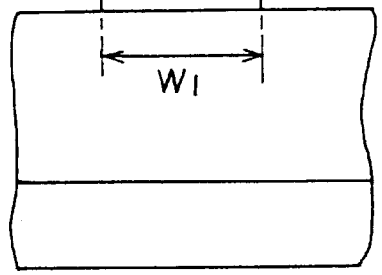
FIG.4B PRIOR ART

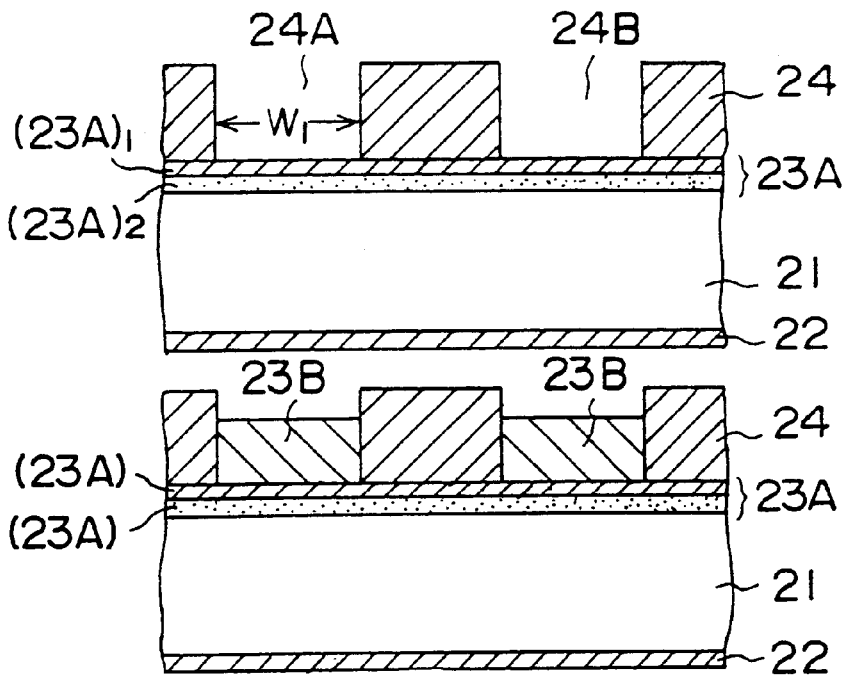
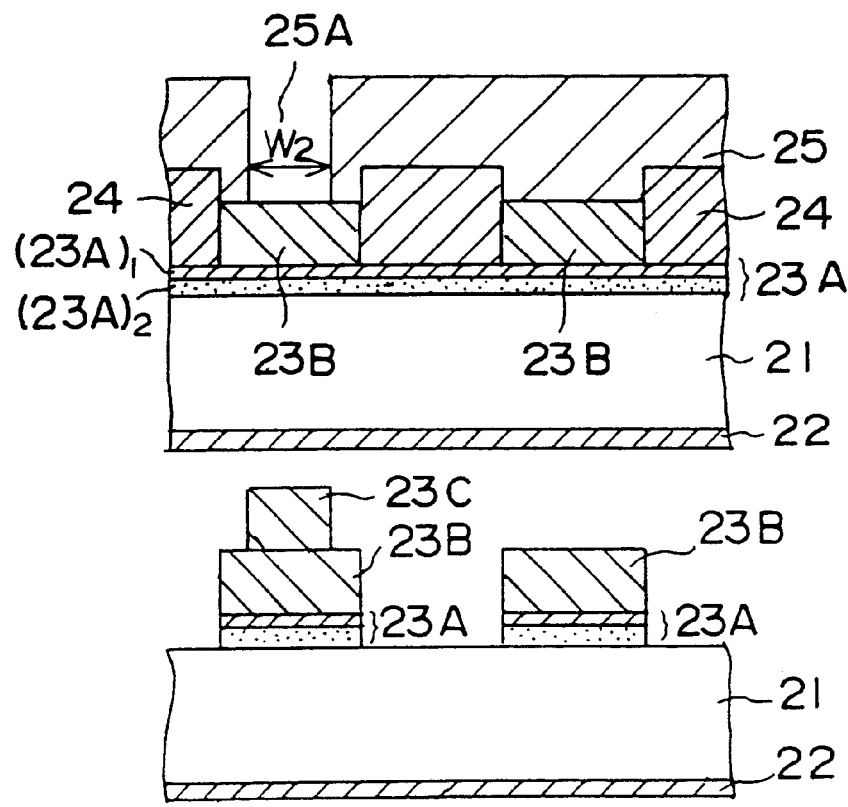
FIG.9A
FIG.9B
FIG.9C
FIG.9D

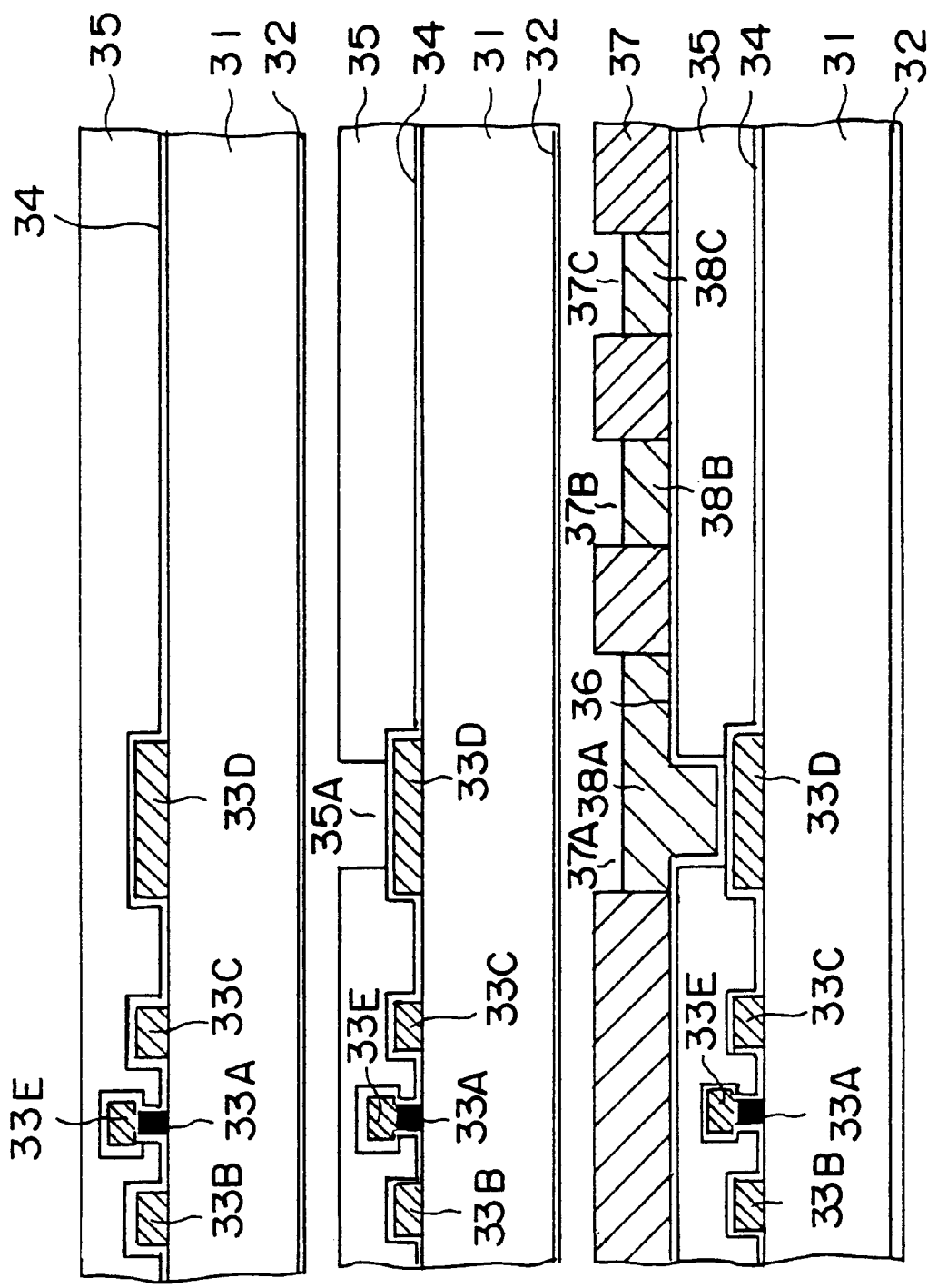

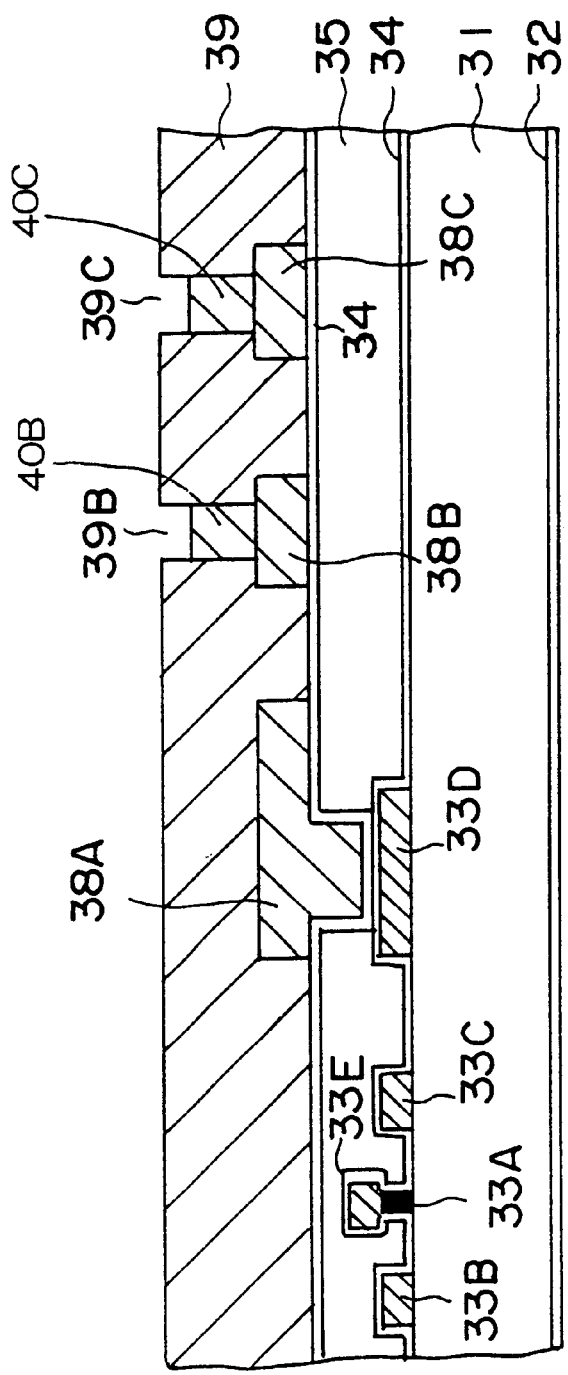
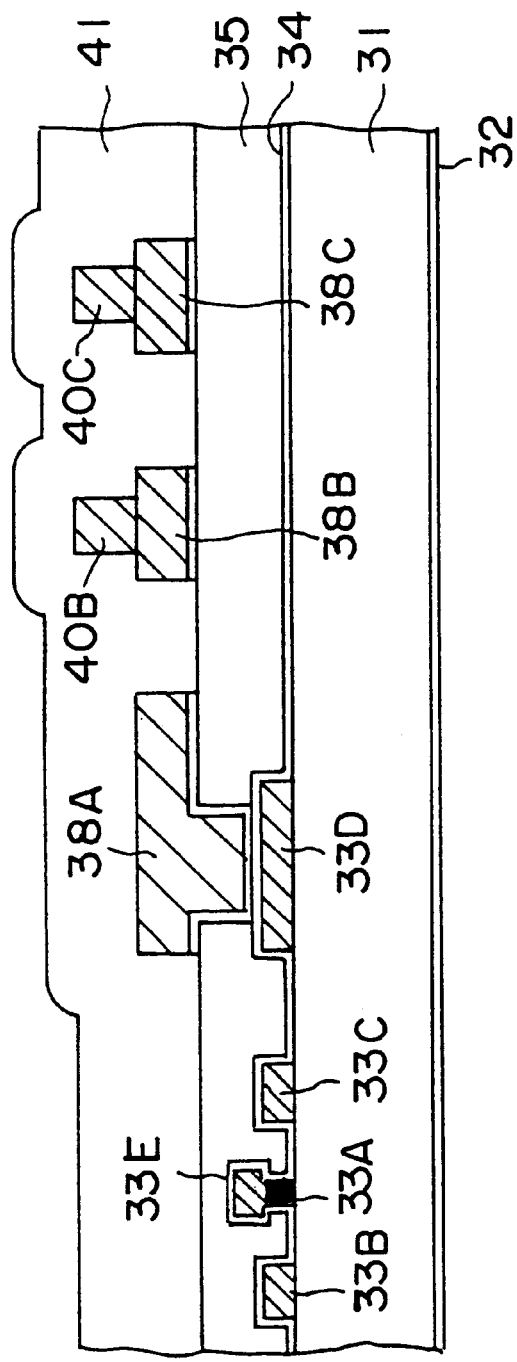
FIG.10D
FIG.10E

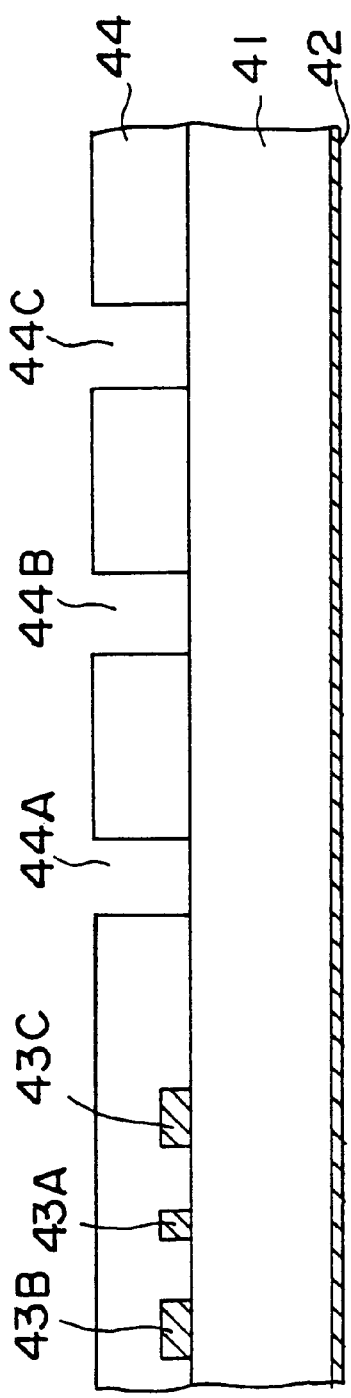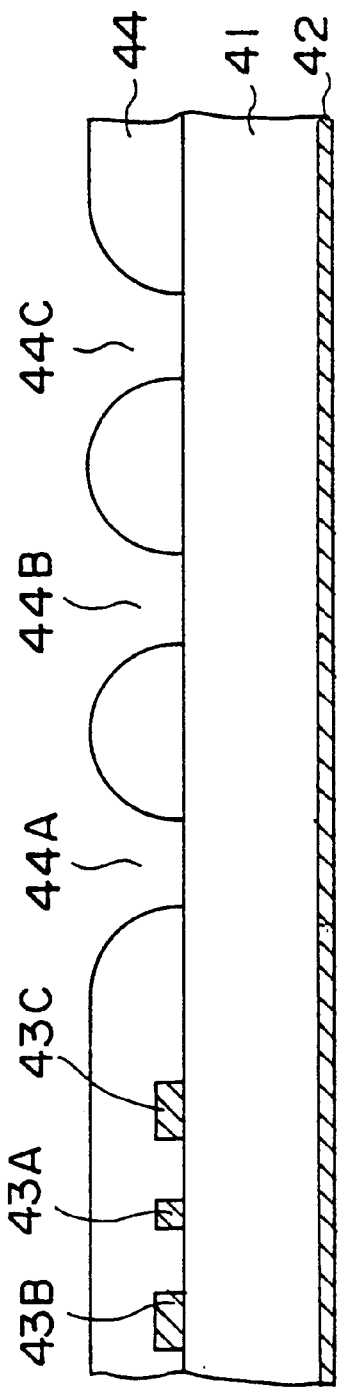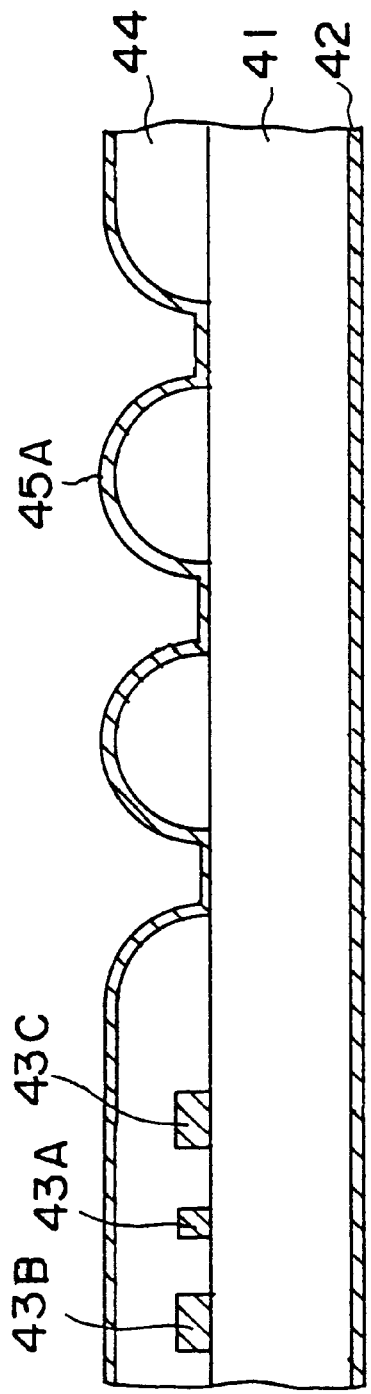

SEMICONDUCTOR DEVICE HAVING A MICROSTRIP LINE

BACKGROUND OF THE INVENTION

The present invention generally relates to semiconductor devices and more particularly to a semiconductor device having a microstrip line and a fabrication process thereof.

Compound semiconductor devices use a compound semiconductor material for the active part thereof. Because of the very small effective mass of electrons in such compound semiconductor materials, compound semiconductor devices are used extensively for high-speed microwave applications, including portable telephones and satellite telecommunications. In these days, such high-speed compound semiconductor devices are constructed in the form of an MMIC (monolithic microwave integrated circuit) in which an active device such as a GaAs FET is integrated with transmission lines, diodes, resistances, capacitances and inductances, all formed on a common semiconductor substrate. In order to improve the total performance of such MMICs, it is necessary to minimize the loss of passive elements used therein and maximize the maximum tolerable current, in addition to the desired improvement in the performance of individual active devices.

FIG. 1 shows a typical microstrip line used in an MMIC.

Referring to FIG. 1, the microstrip line includes a substrate 11 having a bottom surface covered by a conductor film 12, wherein the substrate 11 carries a conductor pattern 13 on a top surface thereof. In the microstrip line of FIG. 1, it can be seen that the conductor pattern 13 is laterally and vertically surrounded by a dielectric material having different dielectric constants. In such a case, there holds no ideal TEM (transverse electromagnetic wave) mode in the signal transmission through the wiring pattern 13, and generation of higher mode electromagnetic field is inevitable.

When such higher modes are generated, electric fields and magnetic fields are created as represented in FIG. 1 respectively by a continuous line and a broken line, and there appears a frequency dependence in the characteristic impedance or effective dielectric constant of the transmission line.

When a large current is to be transmitted through such a microstrip line, it is desired to reduce the thickness of the substrate 11 as much as possible for facilitating heat dissipation. On the other hand, such a decrease in the thickness of the substrate 11 invites unwanted increase in the capacitance component of the microstrip line impedance. In order to avoid this problem of increased capacitance component, it is necessary to reduce the width of the conductor pattern 13 as much as possible. Thereby, the height of the conductor pattern 13 increases inevitably in order to secure a sufficient cross-sectional area for the conductor pattern 13.

In the construction of the microstrip line of FIG. 1, such an increase in the height of the conductor pattern 13 raises another problem explained hereinafter with reference to FIGS. 2A and 2B.

Referring to FIG. 2A showing the case in which the height of the conductor pattern 13 is small, it will be noted that the electric flux lines exit primarily from the bottom surface of the conductor pattern 13 and reach the conductor film 12 at the bottom of the substrate 11 with the shortest paths. Only a very small number of electric flux lines exit from the top surface of the conductor pattern 13 and reach the conductor film 12.

When the height of the conductor pattern 13 is increased as represented in FIG. 2B, on the other hand, a substantial number of electric flux lines exit not only from the bottom surface of the conductor pattern 13 but also from both side walls thereof and reach the conductor film 12 along curved paths. Thereby, there occurs an increase in the capacitance component of the transmission line impedance.

The structure of FIG. 2B further raises a practical problem in that the formation of the structure of FIG. 2B is difficult. When the structure of FIG. 2B is to be formed, it is necessary to deposit a thick resist film on the substrate 11 and form a groove in the resist film by conducting an exposure and developing process. On the other hand, the exposure of such a thick resist film raises a problem in that the exposure dose tends to become insufficient at the bottom part of the resist film due to the optical absorption of the resist. When this occurs, the interconnection pattern 13 tends to have an inversely tapered cross-sectional form as represented in FIG. 2C. In such a conductor pattern 13 having an inversely tapered cross-sectional form, the number of the electric flux lines exiting from the side walls of the interconnection and reaching the conductor film 12 increases inevitably, and the capacitance component of the transmission line impedance is increased substantially.

In order to overcome the foregoing problem, the Japanese Laid-Open Patent Publication 5-802485 describes a microstrip line as represented in FIG. 3, wherein it can be seen that a thin conductor pattern 13A is formed on the substrate 11 with a width $W_1$, and a thick resist film 14 is deposited on the substrate 11 so as to cover the thin conductor pattern 13A.

Further, the resist film 14 is subjected to an exposure and developing process to form a groove having a width $W_2$ smaller than the width $W_1$. By filling the groove thus formed, a thick conductor pattern 13B is formed on the thin conductor pattern 13A with the width of $W_2$ and with a desired height. In FIG. 3, it should be noted that those parts corresponding to the parts described previously are designated by the same reference numerals and the description thereof will be omitted.

On the other hand, the conventional microstrip line of FIG. 3 has a drawback in that, due to the very small thickness of the conductor pattern 13A, it is difficult to form an air bridge structure which is used commonly in the art of MMIC. When an air bridge structure is formed by using the microstrip line of FIG. 3, the conductor pattern 13A easily undergoes a deformation or disconnection in the process of depositing a resist film on the conductor pattern 13A. Thereby, the yield of production of the microstrip line is reduced seriously in the structure of FIG. 3.

Further, the microstrip line of FIG. 3 tends to show the problem of current concentration at the lateral edge part of the conductor pattern 13A as represented in FIGS. 4A and 4B, wherein this problem becomes particularly conspicuous when the microstrip line of FIG. 3 is used to carry GHz-band electric signals. When such a concentration of the electric current occurs, the tall conductor pattern 13B at the center of the thin conductor pattern 13A does not contribute to the transmission of the high-frequency current.

Further, it should be noted that the use of the microstrip line of FIG. 3 in a multilayer interconnection structure shown in FIG. 5 raises another problem in that there is formed a deep depression in the resist film 14 covering an interlayer insulation film 16 when forming an interconnection pattern 13B' in correspondence to such a deep depression of the resist film 14 by a damascene process. In the multilayer interconnection structure of FIG. 5, it should be noted that the interlayer insulation film 16 covers a conductor pattern 15 formed on the substrate 11 and there is formed a contact hole 16A in the interlayer insulation film 16 so as to expose the conductor pattern 15. The foregoing deep resist opening is formed so as to expose the contact hole 16A. As represented in FIG. 5, the contact hole 16A is covered by a conductor film 13A' identical in composition and thickness with the conductor film 13A of the microstrip line of FIG. 3. Thereby, a conductor pattern 13B' is formed by an electroplating process so as to fill the deep resist opening. It should be noted that the microstrip line of FIG. 3 is formed at the right side of the conductor pattern 13B'.

In the structure of FIG. 5, it can be seen that the thickness of the resist film 14 is increased in correspondence to the contact hole 16A as noted above. Thus, the exposure dose tends to become insufficient at the bottom part of the contact hole 16A and a part of the resist film 14 may remain as represented by a numeral 14x. When such a resist fragment 14x remains at the bottom part of the contact hole 16x, the conductor pattern 13B' may become defective.

Further, the multilayer interconnection structure of FIG. 5 has a drawback in that the thin conductor pattern 13A or 13A' is already patterned and it is difficult to grow the thick conductor pattern 13B or 13B' thereon by an electroplating process. In order to conduct an electroplating process, it is necessary to supply a current to the conductor pattern 113A or 13A', while such a supply of the current to the conductor pattern 13A or 13A' is not possible when the conductor patterns 13A and 13A' are already patterned.

SUMMARY OF THE INVENTION

Accordingly, it is a general object of the present invention to provide a novel and useful semiconductor device having a microstrip line, wherein the foregoing problems are eliminated.

Another and more specific object of the present invention is to provide a microstrip line having a reduced resistance component and a reduced capacitance component suitable for carrying a large electric current and a semiconductor device having such a microstrip line.

Another object of the present invention is to provide a microstrip line, comprising:

a first conductor pattern formed on a substrate;

a second conductor pattern formed on said first conductor pattern with a width substantially identical with a width of said first conductor pattern; and a third conductor pattern formed on said second conductor pattern with a width smaller than said width of said second conductor pattern.

Another object of the present invention is to provide a semiconductor device, comprising:

a substrate having first and second, mutually opposing principal surfaces;

a conductor layer formed on said substrate so as to cover said second principal surface;

a first conductor pattern formed on said first principal surface of said substrate;

a second conductor pattern formed on said first conductor pattern with a width identical with a width of said first conductor pattern; and a third conductor pattern formed on said second conductor pattern with a width smaller than said width of said second conductor pattern.

Another object of the present invention is to provide a method of fabricating a semiconductor device having a microstrip line, comprising the steps of:

forming a metal film on a substrate;

forming a first resist pattern on said metal film such that said first resist pattern includes therein a first groove having a first width in conformity with a wiring pattern to be formed;

forming a first conductor pattern on said metal film along said first groove with said first width while using said first resist pattern as a mask;

forming a second resist pattern on said first conductor pattern such that said second resist pattern includes therein a second groove having a second width in conformity with said wiring pattern to be formed;

forming a second conductor pattern on said first conductor pattern along said second groove with said second width while using said second resist pattern as a mask; and patterning said metal film while using said first conductor pattern as a mask.

Another object of the present invention is to provide a method of fabricating a microstrip line, comprising the steps of:

forming a metal film on a substrate;

forming a first resist pattern on said metal such that said first resist pattern includes therein a first groove having a first with in conformity with a wiring pattern to be formed;

forming a first conductor pattern on said metal film along said first groove with said first width while using said first resist pattern as a mask;

forming a second resist pattern on said first conductor pattern such that said second resist pattern includes therein a second groove having a second width in conformity with said wiring pattern to be formed;

forming a second conductor pattern on said first conductor pattern along said second groove with said second width while using said second resist pattern as a mask; and patterning said metal film while using said first conductor pattern as a mask.

According to the present invention, a microstrip line is formed with a conductor pattern having a large cross-sectional area suitable for carrying a large current by an electroplating process without inviting increase of capacitance component in the microstrip line impedance.

Other objects and further features of the present invention will become apparent from the following detailed description when read in conjunction with the attached drawings.

BRIEF DESCRIPTION OF THE DRAWINGS

FIG. 3 is a diagram showing the construction of another conventional microstrip line;

FIGS. 4A and 4B are diagrams explaining the problem pertinent to the microstrip line of FIG. 3;

FIGS. 9A–9D are diagrams showing the fabrication process of a semiconductor device according to a second embodiment of the present invention;

FIGS. 10A–10E are diagrams showing the fabrication process of a semiconductor device according to a third embodiment of the present invention;

FIGS. 11A–11F are diagrams showing the fabrication process of a semiconductor device according to a fourth embodiment of the present invention;

DETAILED DESCRIPTION OF THE PREFERRED EMBODIMENTS

[PRINCIPLE]

Figure 6A:
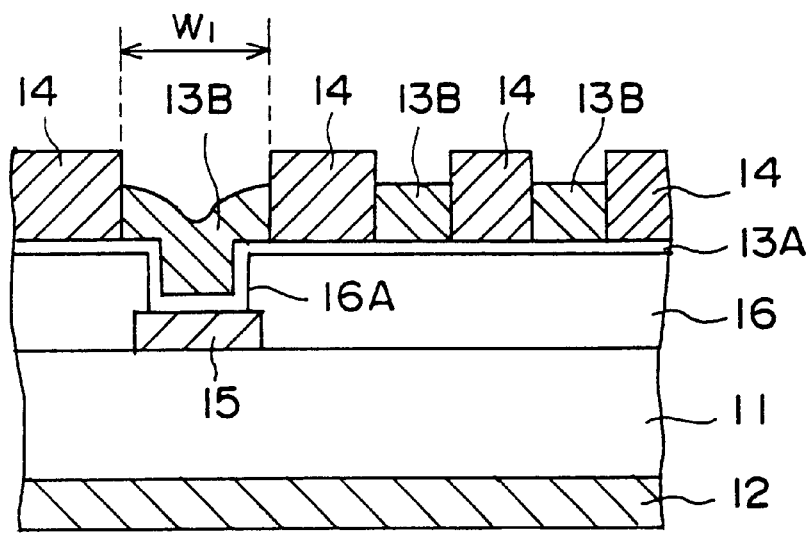
FIGS. 6A–6C are diagrams explaining the principle of the present invention.
Figure 6B:
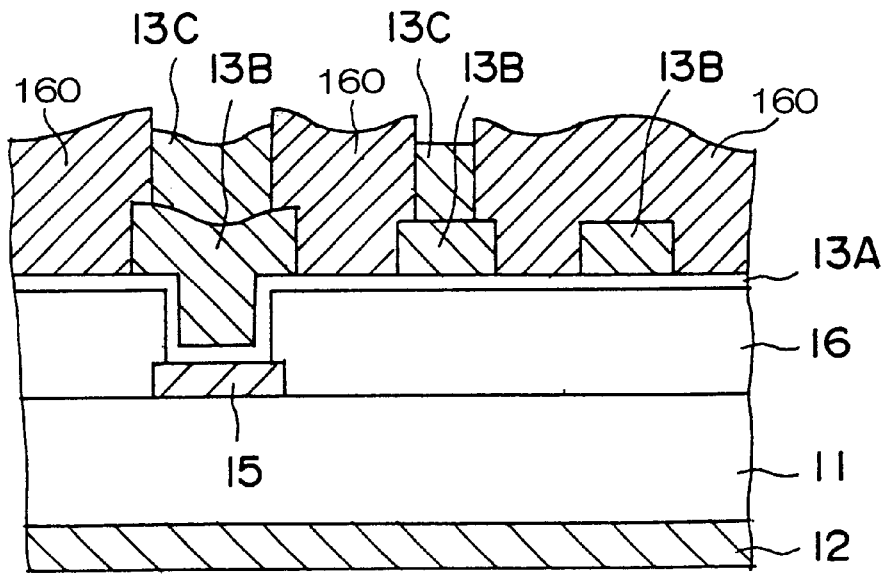
Figure 6C:
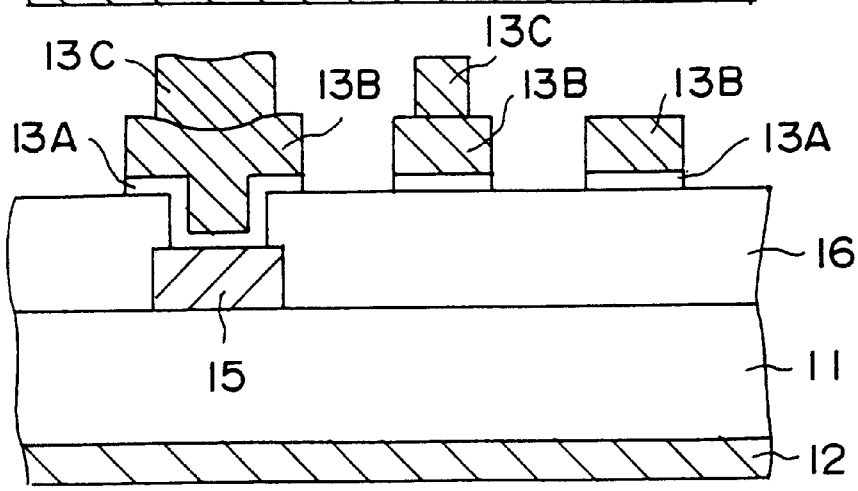

FIGS. 6A–6C show the principle of the microstrip line of the present invention, wherein those parts corresponding to the parts described previously are designated by the same reference numerals and the description thereof will be omitted.

Referring to FIG. 6A, the conductor film 13A is formed on the entire surface of the interlayer insulation film 16 formed on the substrate, such that the conductor film 13A covers continuously the side wall and the bottom wall of the contact hole 16A.

Further, the conductor pattern 13B is formed on the exposed part of the conductor film 13A by an electroplating process while using the resist pattern 14 as a mask. It should be noted that the resist pattern 14 includes a groove having a width $W_1$. As can be seen from FIG. 6A, the conductor film 13A makes a contact with the conductor pattern 15 on the substrate 11 at the bottom part of the contact hole 16A.

Next, in the step of FIG. 6B, the resist pattern 14 is removed, and the resist pattern 160 is deposited on the conductor film 13A such that the conductor film 13A covers both lateral edges of the conductor pattern 13B. It should be noted that the resist pattern 160 includes therein a groove having a width $W_2$ smaller than the foregoing width $W_1$, in correspondence to the conductor pattern 13B. Further, by conducting an electroplating process while using the conductor film 13A as an electrode, a conductor pattern 13C is formed with the width $W_2$, such that the conductor pattern 13C fills the groove in the resist pattern 160.

Next, in the step of FIG. 6C, the resist pattern 160 is removed and the conductor film 13A is patterned while using the conductor pattern 13B as a mask, to form a thin conductor pattern from the conductor film 13A such that the thin conductor pattern has a width and shape identical with those of the conductor pattern 13B.

In the process of FIGS. 6A–6C, it should be noted that the conductor pattern 13A covers the surface of the interlayer insulation film 16 continuously and entirely in the step of forming the conductor pattern 13B or the conductor pattern 13C. Thereby, the conductor patterns 13B and 13C can be formed easily by an electroplating process.

As the desired conductor pattern is formed in two steps in the present invention as represented in FIGS. 6A and 6B, it is possible to achieve a large total height for the conductor pattern while reducing the height of the individual conductor patterns 13B and 13C. By reducing the height of the individual conductor patterns 13B and 13C, it should be noted that the thickness of the resist patterns 14 and 160 can also be reduced. By using such relatively thin resist patterns, it is possible to avoid the problem of insufficient exposure dose, which tends to occur in the construction of FIG. 5 or FIG. 6A in which there appears a very large thickness in the resist film in correspondence to the contact hole 16A.

Figure 7:
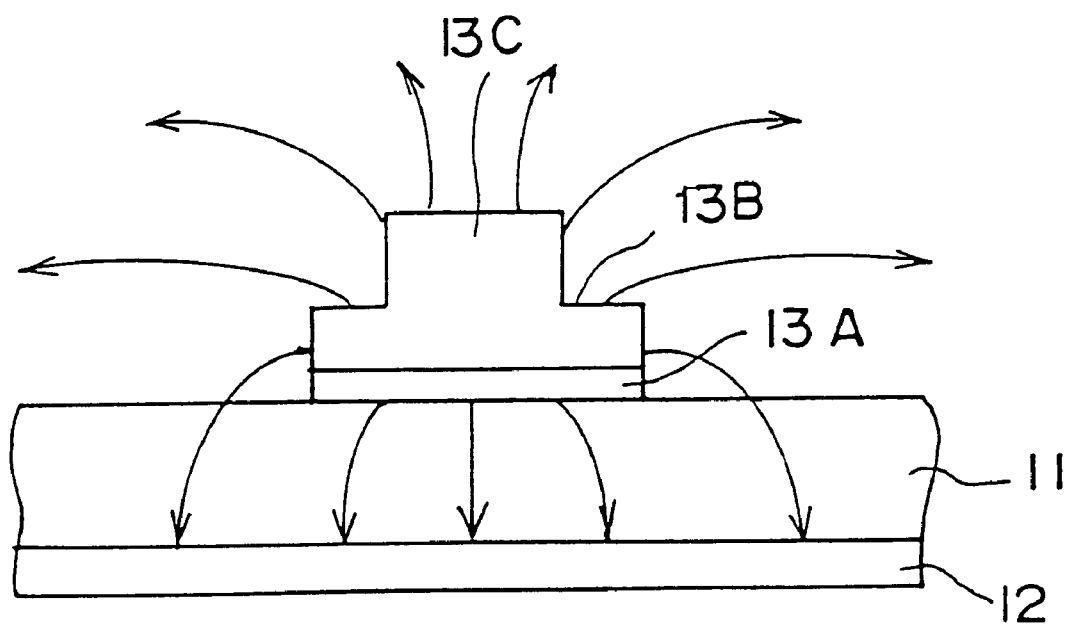
FIG. 7 is a diagram explaining the effect of the present invention.

FIG. 7 shows a typical structure of the microstrip line obtained by the present invention in a cross-sectional view, wherein those parts corresponding to the parts described previously are designated by the same reference numerals and the description thereof will be omitted. In the structure of FIG. 7, the microstrip line includes the conductor patterns 13A–13C formed on the substrate 11, wherein the substrate 11 carries the conductor film 12 at the bottom surface thereof as a ground electrode.

Referring to FIG. 7, the conductor pattern forming the microstrip line is formed of a stacking of the conductor patterns 13A, 13B and 13C, wherein it can be seen that the conductor patterns 13A, 13B and 13C form together a convex shape pointing the upward direction.

In the microstrip line of FIG. 7, it will be noted that the electric flux lines exiting from the side walls of the conductor pattern 13C do not reach the ground electrode 12 at the bottom of the substrate 11. Only the electric flux lines exiting from the bottom surface of the conductor pattern 13A and the side walls of the wide base part 13B reach the ground electrode 12. Thereby, the capacitance component of the microstrip line impedance is improved substantially.

Generally, the impedance of a microstrip line changes when the height or thickness of the conductor pattern is changed. In such a case, it has been necessary in the conventional microstrip lines to redesign the width or length of the conductor pattern. In the case of the microstrip line of FIG. 7, on the other hand, such a change of the impedance is easily attended to without changing the width of the conductor pattern 13A or 13B forming the base part.

Further, the microstrip line of FIG. 7 can be advantageously used to form a spiral coil, as the effective distance between adjacent conductor patterns is increased due to the existence of the conductor pattern 13C having a reduced width. This means that the increase of capacitance is held minimum in the spiral coil even when the height of the conductor pattern 13C is increased.

Further, the structure of FIG. 7 is advantageous to carry a protective structure thereon due to the convex cross-sectional form pointing the upward direction. In such a convex structure, an excellent step coverage is achieved easily when the microstrip line of FIG. 7 is covered by a polyimide film. Thereby, the need of using a thick protective film is effectively eliminated.

First Embodiment

FIGS. 8A–8E show the fabrication process of a semiconductor device according to a first embodiment of the present invention.

Figure 8A:
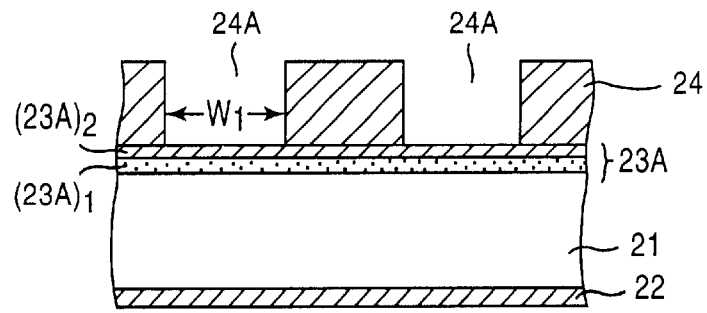
FIGS. 8A–8E are diagrams showing the fabrication process of a semiconductor device according to a first embodiment of the present invention.

Referring to FIG. 8A, a semi-insulating GaAs substrate 21 carries a ground electrode 22 on a bottom principal surface thereof such that the ground electrode 22 covers the bottom principal surface continuously with a uniform thickness. The GaAs substrate 22 further carries, on a top principal surface thereof, a conductive film 23A having an Au/Ti structure, in which the conductive film 28A includes a barrier layer $(23A)_1$ of TiW and a conductor layer $(23A)_2$ of Au stacked thereon. It should be noted that the barrier layer $(23A)_1$ and the conductor layer $(23A)_2$ are deposited consecutively on the top principal surface of the substrate 21 by a sputtering process. In a typical example, the TiW layer $(23A)_1$ and the Au layer $(23A)_2$ are formed to have a thickness of about 100 nm.

In the step of FIG. 8A, a positive resist film 24 is further deposited on the foregoing Au/TiW layer 23A and is subjected to an exposure process according to a desired interconnection pattern. Further, the resist film 24 thus exposed is subjected to a first annealing process at a first temperature preferably lower than about 135° C. After the thermal annealing process, the resist film 24 is subjected to a developing process to form a groove or opening 24A in the resist film 24 in correspondence to the desired interconnection pattern. It should be noted that the foregoing opening 24A is formed with a width $W_1$. After the formation of the opening 24A, the resist film 24 is subjected to a second annealing process at a second temperature lower than the first temperature.

Figure 8B:
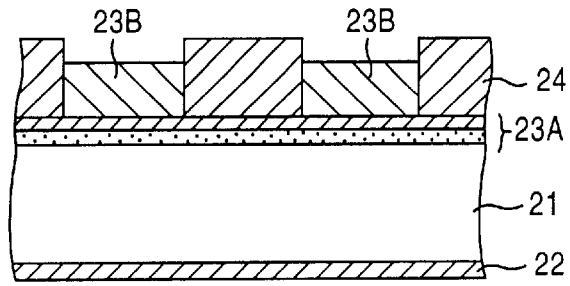

Next, in the step of FIG. 8B, an electroplating process of Au is conducted on the structure of FIG. 8A while using the Au/TiW layer 23 as an electrode, to form a first conductor pattern 23B in correspondence to the foregoing opening 24A.

In the steps of FIGS. 8A and 8B, the resist film 24 is formed with a thickness of typically about 4 µm and the second temperature of the second annealing process is set to about 100° C., which is higher than the temperature of the electroplating process of FIG. 8B. In the electroplating process of FIG. 8B, the conductor pattern 23B is formed with a thickness of about 3.0 µm. By setting the thickness of the resist film 24 to the foregoing value of 4 µm and by using a transparent resin such as a novolak resin for the resist film 24, the problem of optical absorption by the resist film 24 at the time of the exposure process is minimized and the opening 24A is formed in the step of FIG. 8A so as to be defined by a vertical side wall. Further, by applying a thermal annealing process to the resist film 24 prior to the formation of the opening 24A at the foregoing first temperature of about 135° C. or lower, the problem of deformation of the opening 24A is successfully avoided even when the second annealing process is applied at the second temperature after the developing process. In order to avoid the problem of decrease of photosensitivity, it is desirable to set the first temperature to be about 135° C. or lower, such that excessive cross-linking reaction does not occur in the resin of the resist film 24 prior to the developing process. Further, the second temperature is set lower than the first temperature so as to avoid the deformation of the opening 24A as noted previously.

Figure 8C:
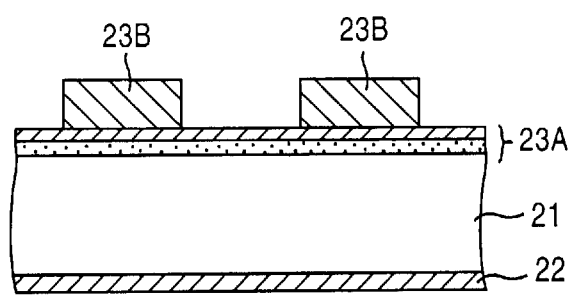
Figure 8D:
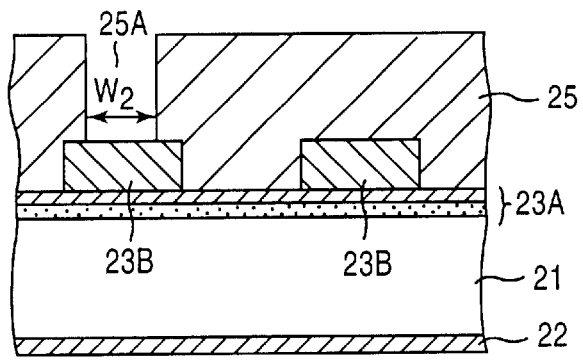

Next, in the step of FIG. 8C, the resist film 24 is removed by a solvent and a second resist film 25 is applied to the structure of FIG. 8C in the step of FIG. 8D with a thickness of typically about 5 µm such that the second resist film 25 covers the conductor pattern 23B. As the resist film 25 covers the conductor pattern 23B, the thickness of the resist film 25 is slightly larger than a thickness of the resist film 24. The resist film 25 thus deposited is subjected to an exposure and developing process, and there is formed an opening 25A in the resist film 25 in correspondence to the conductor pattern 23B with a width $W_2$ smaller than the width $W_1$.

Next, in the step of FIG. 8D, an electroplating process of Au is conducted on the structure of FIG. 8D while using the conductor film 23A as an electrode, to form a conductor pattern 23C (see FIG. 8E) with a thickness of typically about 3 µm. In the electroplating step of FIG. 8D, the conductor film 23A covers the surface of the substrate 21 continuously and the electroplating process of the conductor pattern 23C is achieved with reliability on the underlying conductor pattern 23B.

Figure 8E:
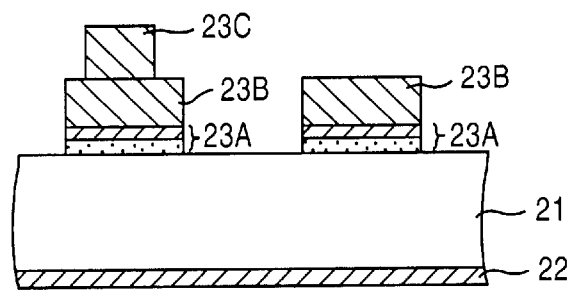

Finally, in the step of FIG. 8E, the Au/TiW conductor film 23A is patterned by an ion milling process while using the conductor pattern 23B as a mask, and there is formed a conductor pattern identical in size and shape with the conductor pattern 23B on the substrate 21 from the conductor film 23A.

In the present embodiment, the conductor film 23A covers the entire top principal surface of the substrate 21 continuously when forming the conductor pattern 23B or 23C. Thereby, the conductor patterns 23B and 23C can be formed easily and reliably by way of the electroplating process.

Figure 1:
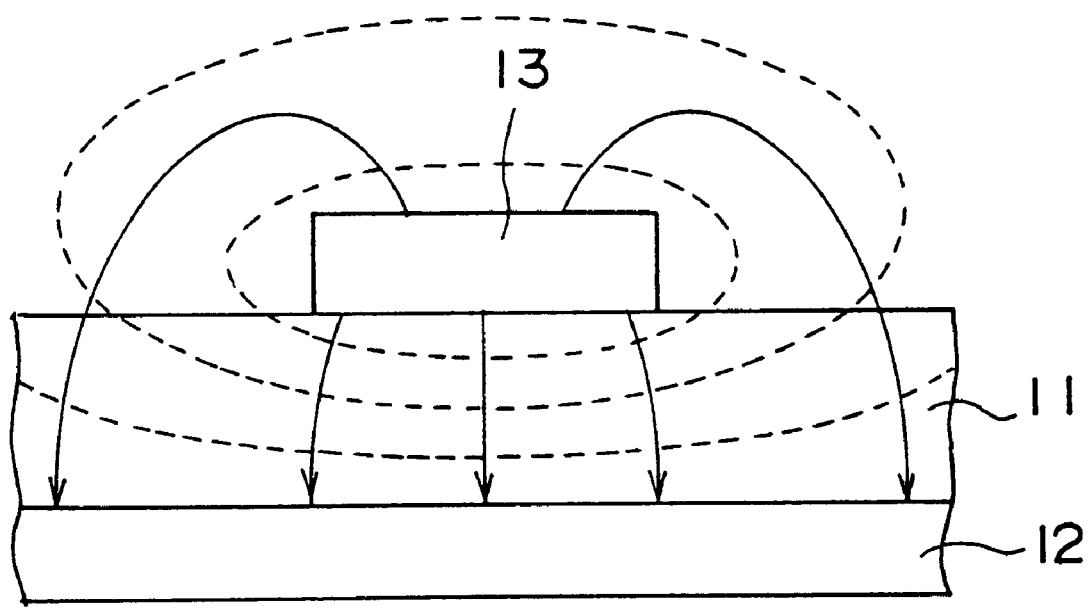
FIG. 1 is a diagram showing the construction of a conventional microstrip line.
Figure 2A:
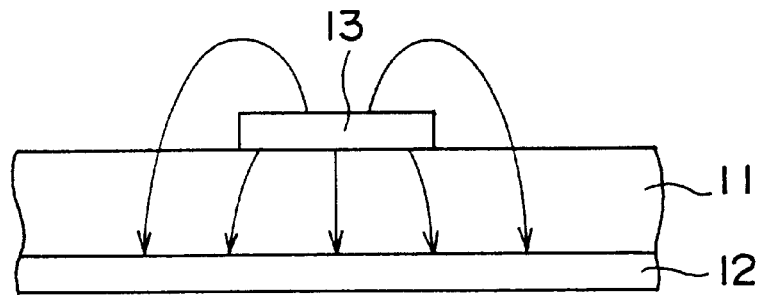
FIGS. 2A–2C are diagrams explaining the problems in the conventional microstrip line.
Figure 2B:
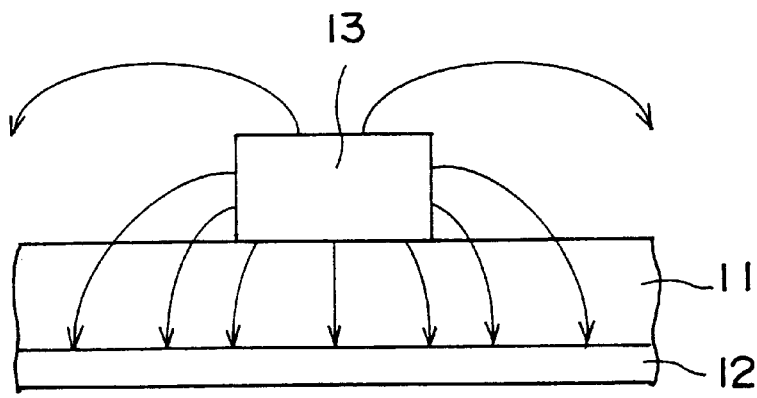
Figure 2C:
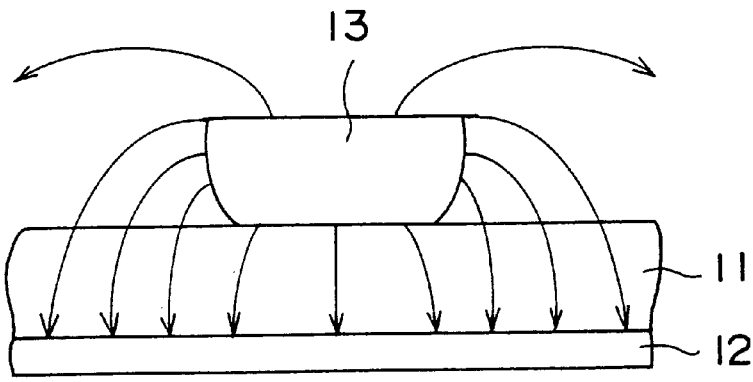
Figure 5:
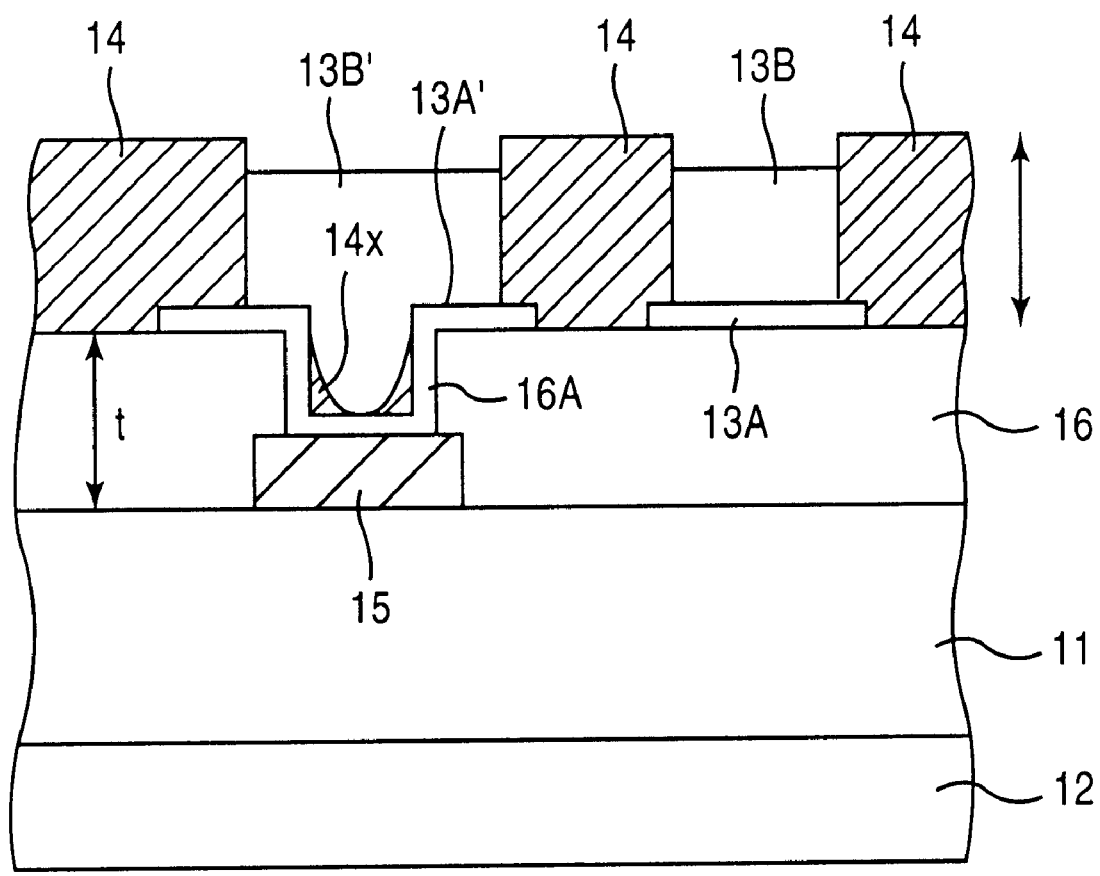
FIG. 5 is a diagram explaining another problem of the microstrip line of FIG. 3.

Another advantageous feature of the present invention is that the desired conductor pattern is formed by repeating the electroplating process twice. Thereby, it is possible to form the conductor pattern to have a large overall height by stacking the conductor patterns 23B and 23C, each having a reduced height. This means that it is possible reduce the thickness of the resist pattern 24 used in the step of FIG. 8A or the thickness of the resist pattern 25 of FIG. 8D as measured from the top surface of the conductor pattern 23B, and the problem of difficulty of exposure explained with reference to FIG. 5 is effectively avoided.

As will be understood from the cross-sectional view of FIG. 8E, the conductor patterns 23A–23C form together a generally convex conductor pattern having a wide base part and a tall central part projecting in the upward direction similarly to the structure explained with reference to FIG. 7. Thereby, the number of the electric flux lines exiting from the conductor pattern and reaching the ground pattern 22 is reduced substantially and the capacitance component of the microstrip line impedance is effectively reduced, while simultaneously securing a sufficient cross-sectional area for carrying a large electric current.

Generally, the impedance of a microstrip line changes when the height or thickness of the conductor pattern is changed. In such a case, it has been necessary in the conventional microstrip lines to redesign the width or length of the conductor pattern. In the case of the microstrip line of FIG. 8E, such a change of the impedance is easily attended to without changing the width or length of the conductor pattern 23A or 23B forming the base part.

Further, the microstrip line of FIG. 8E can be advantageously used to form a spiral coil, as the effective distance between adjacent conductor patterns is increased due to the existence of the narrow conductor pattern 23C having a reduced width. This means that the increase of capacitance is held minimum in the spiral coil even when the height of the conductor pattern 23C is increased.

Further, the structure of FIG. 8E is advantageous to carry a protective structure thereon due to the convex cross-sectional form pointing the upward direction. In such a convex structure, an excellent step coverage is achieved easily when the microstrip line of FIG. 8E is covered by a polyimide film. Thereby, the use of thick protective film is effectively eliminated.

In the present embodiment, there is a further advantageous feature in that, due to the limited width of the pattern 23C, the deposition rate of the electroplating process for forming the conductor pattern 23C is increased and the throughput of production of the semiconductor device is improved substantially. As the width of the pattern 23C is limited, the amount of Au used for the conductor pattern 23C is reduced substantially.

In the case the conductor pattern 23C has the width $W_2$ thereof of 3 µm, it is sufficient that the conductor pattern 23B underneath the conductor pattern 23C has the width $W_1$ of 4 μm for achieving the foregoing suppressing of the capacitance component in the microstrip line impedance. In this case, there is formed a lateral step of 0.5 μm on the top surface of the conductor pattern 23B in correspondence to both lateral sides of the conductor pattern 23C.

As explained before, the present embodiment is related to a compound semiconductor device constructed on a compound semiconductor substrate such as GaAs. However, the present invention is by no means limited to such a compound semiconductor device but is applicable also to Si semiconductor devices. Further, the substrate 21 of the present embodiment is by no means limited to a semiconductor substrate but may be a multilayer substrate used in printed circuit boards.

Second Embodiment

FIGS. 9A–9D show the fabrication process of a semiconductor device according to a second embodiment of the present invention, wherein those parts corresponding to the parts described previously are designated by the same reference numerals and the description thereof will be omitted.

Referring to the drawings, it is noted that the process of FIGS. 9A and 9B are substantially identical with the process of FIGS. 8A and 8B, wherein the present embodiment eliminates the step of FIG. 8C of removing the resist film 24 and deposits the resist film 25 in the step of FIG. 9C directly on the structure of FIG. 9B.

In the present embodiment, it is desired to use an acrylic resist for the resist film 24 for avoiding the problem of cracking, as the resist film 24 is not removed after the electroplating process of FIG. 9B.

After the formation of the resist film 25, the electroplating process of the conductor pattern 23C is conducted similarly to the previous embodiment and the structure of FIG. 9D is obtained.

In the present embodiment, there is an advantageous feature, in addition to the foregoing advantageous feature of eliminating the step of removing the resist film 24, in that the planarization of the resist film 25 is facilitated in the step of FIG. 8D due to the existence of the underlying resist film 24. Associated with this, it is possible to reduce the thickness of the resist film 25 as compared with the case of the previous embodiment.

Third Embodiment

FIGS. 10A–10E show the fabrication process of a semiconductor device having a spiral coil according to a third embodiment of the present invention.

Referring to FIG. 10A, a ground electrode 32 covers a bottom principal surface of an GaAs substrate 31 of the n-type, and the GaAs substrate 31 carries, on a top principal surface thereof, a MESFET including a gate electrode 33A and source and drain electrodes 33B and 33C. Further, the substrate 31 carries thereon a capacitor electrode pattern 33D adjacent to the MESFET. The gate electrode 33A makes a Schottky contact with the GaAs substrate 31 and carries thereon a low-resistance pattern 33E. The ohmic electrodes 33B and 33C make an ohmic contact with the GaAs substrate 31 as usual in the art.

The MESFET and the capacitor electrode pattern 33D are covered by an SiN film 34 deposited on the surface of the substrate 31 and the SiN film 34 is covered by an interlayer insulation film 35 of polyimide.

Next, in the step of FIG. 10B, an opening 35A is formed in the interlayer insulation film 35 so as to expose the capacitor electrode pattern 33D, and a step of FIG. 10C is conducted in which a conductive film 36 having the Au/TiW structure is deposited on the interlayer insulation film 35 so as to include the foregoing opening 35A. Further, a first resist film 37 is deposited on the conductive film 36 by a spin-coating process so as to include the depression corresponding to the foregoing opening 35A, followed by an exposure and developing process to form a resist opening 37A therein in correspondence to the capacitor electrode pattern 33D. Further, resist openings 37B and 37C are formed in the resist film 37 in correspondence to a spiral coil to be formed adjacent to the capacitor electrode 33D.

In the step of FIG. 10B, an electroplating process of Au is conducted subsequent to the formation of the resist openings 37A–37C while using the conductive film 36 as an electrode, and there are formed patterns 38B and 38C forming a spiral coil pattern.

Next, in the step of FIG. 10D, the resist film 37 is removed and another resist film 39 is formed so as to cover the capacitor electrode 38A and the spiral coil patterns 38B and 38C. Further, an exposure and developing process is applied to the resist film 39 thus deposited, to form resist openings 39B and 39C respectively in correspondence to the spiral coil patterns 38B and 39C but with a width smaller than a width of the resist openings 37B and 37C formed in the resist film 37 in the previous step. Further, an electroplating process of Au is applied while using the conductive film 36 as an electrode, to form spiral coil patterns 40B and 40C respectively on the spiral coil patterns 38B and 38C but with a reduced width.

After the formation of the spiral coil patterns 40B and 40C, the step of FIG. 10E is conducted in which the resist film 39 is removed and the conductive film 36 is further subjected to a patterning process conducted by an ion milling process while using the capacitor electrode 38A and the spiral coil patterns 38B and 38C as a mask. Further, a polyimide protective film 41 is deposited on the structure thus formed.

In the present embodiment, too, the conductive film 36 covers the entire top surface of the interlayer insulation film 35 during the electroplating process of the conductor patterns 38A–38C or the conductor patterns 39B and 39C. Thus, the conductor patterns 38A–38C or 40B and 40C can be formed easily and reliably by the electroplating process.

Further, it should be noted that the desired conductor pattern of the spiral coil pattern is formed by repeating the electroplating process twice. Thereby, it is possible to form the spiral coil pattern to have a large overall height by stacking the conductor patterns each having a reduced height. This means that it is possible reduce the thickness of the resist film 37 used in the step of FIG. 10C or the thickness of the resist film 39 of FIG. 10D as measured from the top surface of the conductor pattern 38A, 38B or 38C. Thereby, the problem of difficulty of exposure explained with reference to FIG. 5 is effectively avoided.

As will be understood from the cross-sectional view of FIG. 10E, the conductor patterns 38B and 38C or 40B and 40C form together a generally convex conductor pattern having a wide base part and a tall central part projecting in the upward direction similarly to the structure explained with reference to FIG. 7. Thereby, the number of the electric flux lines exiting from the conductor pattern and reaching the ground pattern 32 is reduced substantially and the capacitance component of the microstrip line impedance is effectively reduced, while simultaneously securing a sufficient cross-sectional area for carrying a large electric current.

Generally, the impedance of a microstrip line changes when the height or thickness of the conductor pattern is changed. In such a case, it has been necessary in the conventional microstrip lines to redesign the width or length of the conductor pattern. In the case of the microstrip line of FIG. 10E, such a change of the impedance is easily attended to without changing the width of the conductor pattern 38B or 38C forming the base part.

Further, it should be noted that the effective distance between adjacent conductor patterns is increased in the spiral coil pattern of FIG. 10E due to the existence of the narrow conductor pattern 40B or 40C having a reduced width on the base conductor pattern 38B or 38C. This means that the increase of capacitance is held minimum in the spiral coil even when the height of the conductor pattern 40B or 40C is increased so as to increase the electric current in the spiral coil.

Further, the structure of FIG. 10E is advantageous to carry a protective structure thereon due to the convex cross-sectional form pointing the upward direction. In such a convex structure, an excellent step coverage is achieved easily when the spiral coil pattern of FIG. 10E is covered by a polyimide film. Associated with this, the coil pattern can be formed successfully by the foregoing resist process and electroplating process, even when the separation between the coil patterns 38B and 38C is reduced to about 3 μm. In the present embodiment, too, the resist films 37 and 39 are subjected to the first and second thermal annealing processes similarly to the case of the first embodiment.

FOURTH EMBODIMENT

FIGS. 11A–11F show the fabrication process of a semiconductor device having an air bridge structure according to a fourth embodiment of the present invention.

Referring to FIG. 11A, a ground electrode 42 covers a bottom principal surface of an GaAs substrate 41 of the n-type, and the GaAs substrate 41 carries, on a top principal surface thereof, a MESFET including a gate electrode 43A and source and drain electrodes 43B and 43C, wherein the gate electrode 43A makes a Schottky contact with the GaAs substrate 41, while the ohmic electrodes 43B and 43C make an ohmic contact with the GaAs substrate 41 as usual in the art.

In the step of FIG. 11A, the substrate 41 further carries thereon a resist film 44 so as to cover the MESFET, wherein the resist film 44 thus formed includes resist openings 44A, 44B and 44C each exposing the top surface of the substrate 41, wherein the openings 44a, 44B and 44C are formed by an exposure and developing process.

Next, in the step of FIG. 11B, the structure of FIG. 11A is subjected to a thermal annealing process to induce a reflowing in the resist film 44. As a result of the reflowing process, the edge of the resist openings 44A, 44B and 44C is rounded and the resist openings 44A, 44B and 44C are defined by a smooth, curved side wall.

Figure 11D:
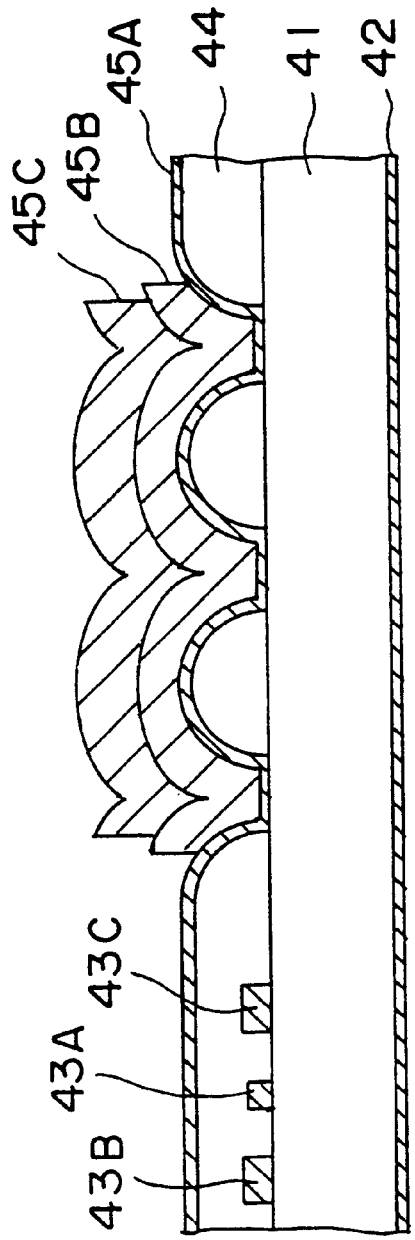

Next, in the step of FIG. 11C, a conductive film 45A having the Au/TiW structure is deposited on the structure of FIG. 11B uniformly by a sputtering process, and the step of FIG. 11D is conducted subsequently, in which a two-step electroplating process using a resist pattern (not shown) described already with reference to the preceding embodiments is carried out on the conductive film 45A. As a result of this, a lower conductor pattern 45B and an upper conductor pattern 45C are formed on the conductive film 45A.

Figure 11E:
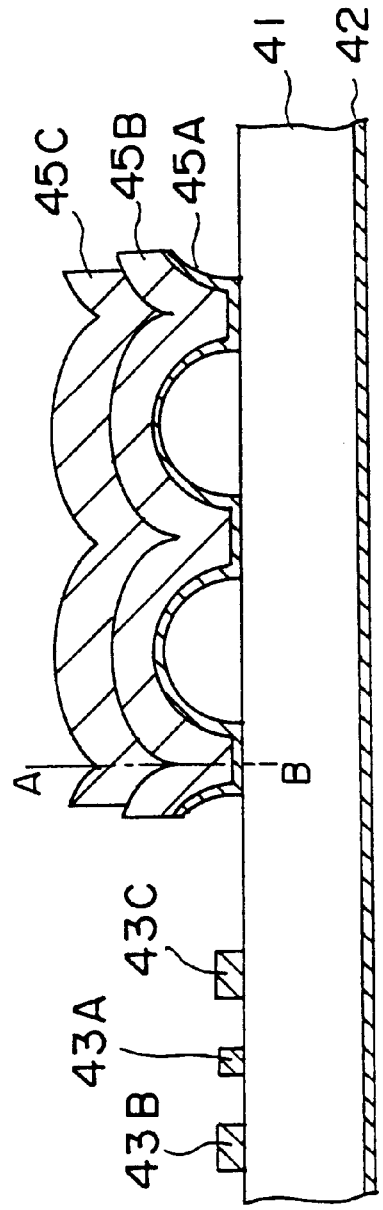

Next, in the step of FIG. 11E, the resist pattern used in the foregoing two-step electroplating process and the resist film 44 formed on the substrate 41 are removed by an ashing process, and a hollow air bridge structure is obtained.

Figure 11F:
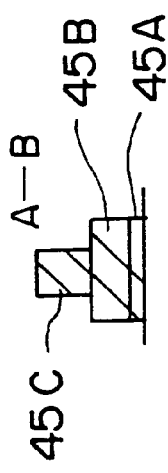

As indicated in the transverse cross-sectional view of FIG. 11F, the air bridge pattern thus formed includes a wide base part formed of the conductive film 45A and the conductor pattern 45B and a narrow top part formed of the conductor pattern 45C. It should be noted that FIG. 11F shows the air bridge pattern in the cross-section taken along the line A–B of FIG. 11E.

According to the air bridge structure of the present embodiment, the thin conductive film 45A does not project laterally from the side edges of the conductor pattern 45B forming the air bridge structure even in such a case the resist film 41 is removed in the state of FIG. 11E. Thereby, the problem of deformation or damage to the thin conductive film 45A is effectively eliminated.

FIFTH EMBODIMENT

Figure 12A:
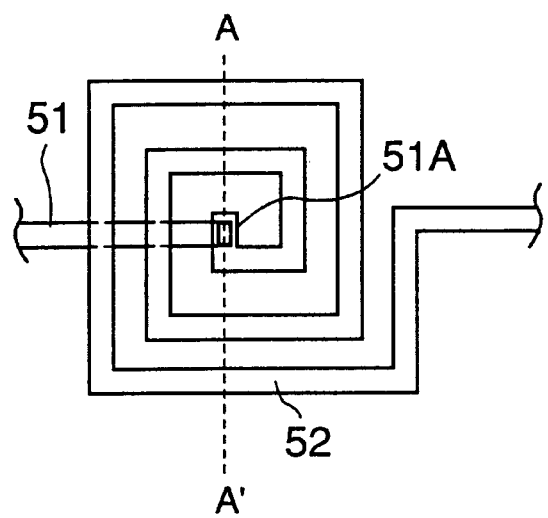
FIGS. 12A and 12B are diagrams showing the construction of a semiconductor device according to a fifth embodiment of the present invention respectively in a plan view and a cross-sectional view.
Figure 12B:
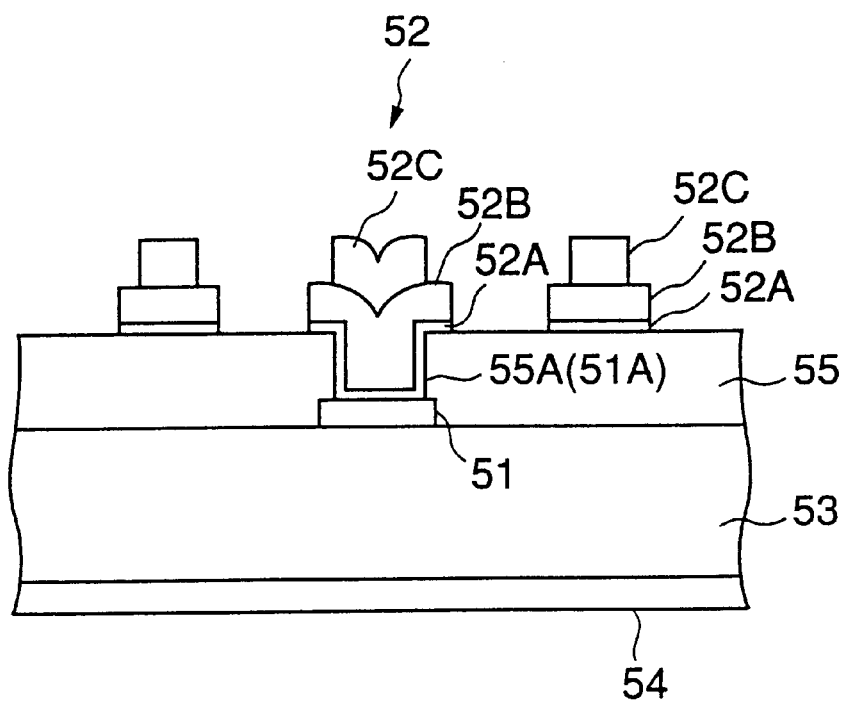

FIGS. 12A and 12B show the construction of a semiconductor device having a spiral coil according to a fifth embodiment of the present invention, wherein FIG. 12A shows the semiconductor device in a plan view, while FIG. 12B shows the semiconductor device in a cross-sectional view taken along a line A–A'.

Referring to the plan view of FIG. 12A, the spiral coil is formed of a lower conductor pattern 51 and an upper spiral pattern 52, wherein the lower conductor pattern 51 is connected electrically to the upper spiral pattern 52 at a contact hole 51A.

Referring to the cross-sectional view of FIG. 12B, the semiconductor device is constructed on a substrate 53 carrying a ground electrode 54 at a bottom surface thereof, and the foregoing conductor pattern 51 extends on the top surface of the substrate 53. The lower conductor pattern 51 is covered by an interlayer insulation film 55 formed on the substrate 53, and a contact hole 55A is formed in the interlayer insulation film 55 in correspondence to the contact hole 51A of FIG. 12A so as to expose the lower conductor pattern 51.

Further, a conductive pattern 52A having the Au/TiW structure is provided on the interlayer insulation film 55 so as to cover the side wall and bottom surface of the contact hole 55A, and a conductor pattern 52B is formed on the conductive pattern 52A in conformity with the shape and size of the conductive pattern 52A. Further, a conductor pattern 52C is formed on the conductor pattern 52B in conformity with the shape of the conductor pattern 52B, wherein the conductor pattern 52C thus formed has a reduced width as compared with the width of the conductor pattern 52B. It should be noted that the conductive pattern 52A and the conductor patterns 52B and 52C constitute the spiral coil pattern 52. The coil pattern 52 is wound around the contact hole 51A that coincides with the contact hole 55A.

SIXTH EMBODIMENT

Figure 13A:
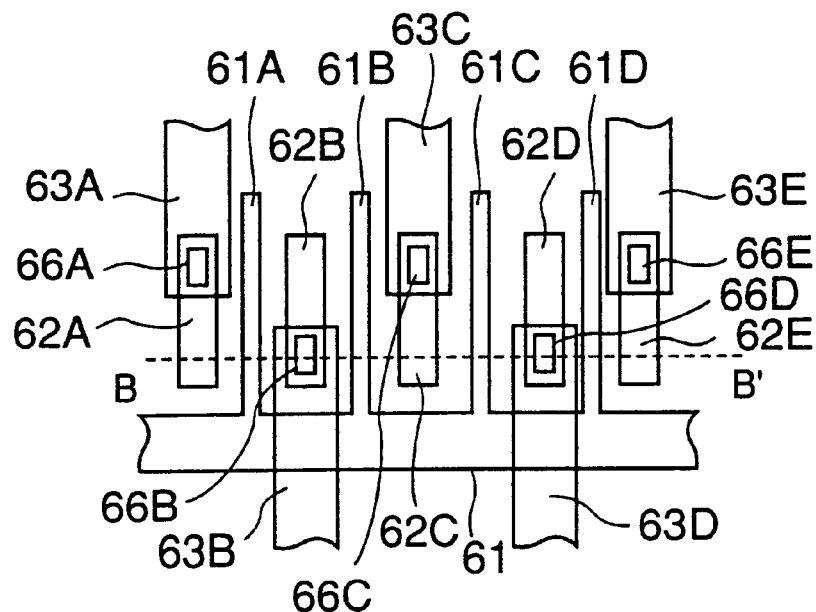
FIGS. 13A and 13B are diagrams showing the construction of a semiconductor device according to a sixth embodiment of the present invention respectively in a plan view and a cross-sectional view.
Figure 13B:
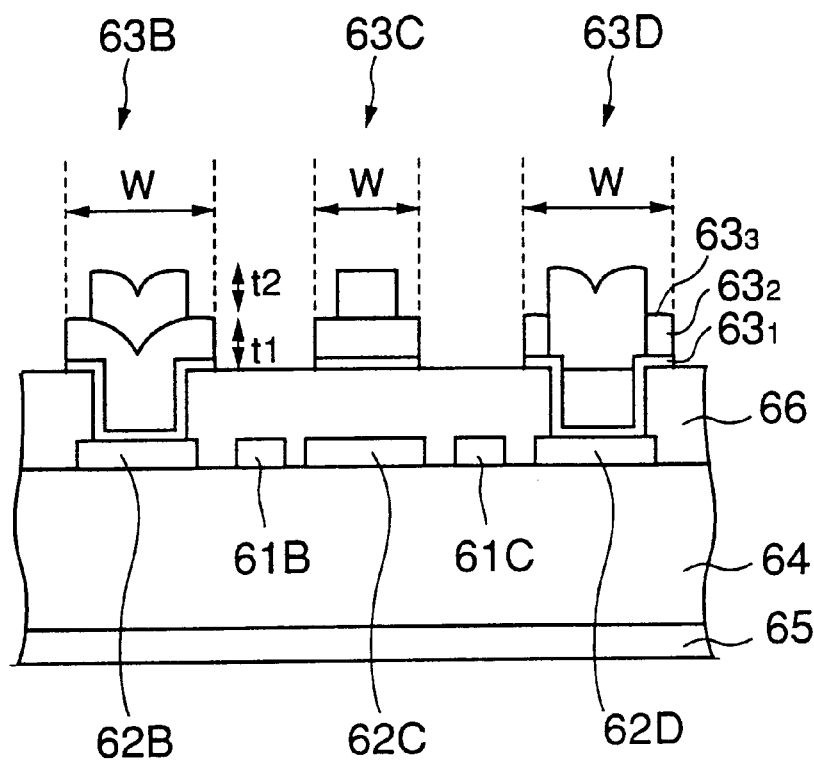

FIGS. 13A and 13B show the construction of a semiconductor device according to a sixth embodiment of the present invention, wherein FIG. 13A shows a plan view while FIG. 13B shows a cross-sectional view taken along a line B–B' of FIG. 13A.

Referring to the plan view of FIG. 13A, the semiconductor device of the present embodiment includes a gate pattern 61 including gate electrode patterns 61A–61D and ohmic electrode patterns 62A–62E interposed between the gate electrode patterns 61A–61D, wherein the ohmic electrode patterns 62A–62E are connected to corresponding upper conductor patterns 63A–63E at respective contact holes 66A–66E.

Referring to the cross-sectional view of FIG. 13B, the semiconductor device of the present embodiment is formed on a semiconductor substrate 64 having a bottom surface covered by a ground electrode 65. Thereby, the gate pattern 61 including the gate electrode patterns 61A–61D and the foregoing ohmic electrode patterns 62A–62E are formed on the top surface of the substrate 64. More specifically, the gate pattern 61 and the ohmic electrode patterns 62A–62E are covered by an interlayer insulation film 66, and the ohmic electrode patterns 62A–62E are connected to corresponding conductor patterns 63A–63E formed on the interlayer insulation film 66 via respective, corresponding contact holes 66A–66E formed in the interlayer insulation film 66.

In the semiconductor device of the present embodiment, it should be noted that each of the conductor patterns 63A–63E is formed of a conductive pattern $63_1$ corresponding to the conductive pattern 23A of the previous embodiment, a conductor pattern $63_2$ corresponding to the conductor pattern 23B, and a conductor pattern $63_3$ corresponding to the conductor pattern 23C. The conductor patterns $63_1$ and $63_2$ have the same width W, while the conductor pattern $63_3$ has a width smaller than the foregoing width W.

Further, the present invention is not limited to the embodiments described heretofore, but various variations and modifications may be made without departing from the scope of the invention.

What is claimed is:

1. A microstrip line, comprising:

a first conductor pattern formed on a substrate;

a second conductor pattern formed on said first conductor pattern with a width substantially identical with a width of said first conductor pattern, said second conductor pattern extending along a length of said first conductor pattern; and a third conductor pattern formed on said second conductor pattern with a width smaller than said width of said second conductor pattern, said third conductor pattern extending along a length of said second conductor pattern, said second and third conductor patterns having a generally identical thickness substantially thicker than a thickness of the first conductor pattern.

2. A microstrip line as claimed in claim 1, wherein said first conductor pattern and said second conductor pattern are defined laterally by a common side wall.

3. A microstrip line as claimed in claim 1, wherein said second and third conductor patterns are formed of a common conductive material, said first conductor pattern being formed of a different conductive material.

4. A semiconductor device, comprising:

a substrate having first and second, mutually opposing principal surfaces;

a conductor layer formed on said substrate so as to cover said second principal surface;

a first conductor pattern formed on said first principal surface of said substrate;

a second conductor pattern formed on said first conductor pattern with a width identical with a width of said first conductor pattern, said second conductor pattern extending along a length of said first conductor pattern; and a third conductor pattern formed on said second conductor pattern with a width smaller than said width of said second conductor pattern, said third conductor pattern extending along a length of said second conductor pattern, said second and third conductor patterns having a generally identical thickness substantially thicker than a thickness of the first conductor pattern.

5. A semiconductor device as claimed in claim 4, wherein said first conductor pattern and said second conductor pattern are laterally defined by a common side wall.

6. A semiconductor device as claimed in claim 4, wherein said second and third conductor patterns are formed of a common conductive material, said first conductor pattern being formed of a different conductive material.

7. A semiconductor device as claimed in claim 4, wherein said first through third conductor patterns are formed on an air bridge structure on said substrate.

8. A semiconductor device as claimed in claim 4, wherein said substrate carries an interlayer insulation film, and wherein said first conductor pattern extends continuously over a top surface of said interlayer insulation film and a side wall and a bottom surface of a contact hole formed in said interlayer insulation film.

* * * * *